United States Patent
Shukh et al.

(10) Patent No.: US 8,405,421 B2
(45) Date of Patent: Mar. 26, 2013

(54) NONVOLATILE FULL ADDER CIRCUIT

(76) Inventors: Alexander Mikhailovich Shukh, Savage, MN (US); Tom A. Agan, Maple Grove, MN (US)

( * ) Notice: Subject to any disclaimer, the term of this patent is extended or adjusted under 35 U.S.C. 154(b) by 0 days.

(21) Appl. No.: 13/483,452

(22) Filed: May 30, 2012

(65) Prior Publication Data

US 2012/0306536 A1    Dec. 6, 2012

Related U.S. Application Data

(60) Provisional application No. 61/493,407, filed on Jun. 3, 2011.

(51) Int. Cl.
G06F 7/50 (2006.01)
(52) U.S. Cl. ............... 326/55; 326/121; 708/670
(58) Field of Classification Search .......... 326/52, 326/55, 112, 119, 121; 708/505, 670
See application file for complete search history.

(56) References Cited

U.S. PATENT DOCUMENTS

| | | | |
|---|---|---|---|
| 4,689,763 A | 8/1987 | Fang | |
| 5,875,124 A | 2/1999 | Takahashi | |
| 5,905,667 A * | 5/1999 | Lee | 708/700 |
| 6,055,557 A | 4/2000 | Beck et al. | |
| 7,026,841 B2 * | 4/2006 | Kameyama et al. | 326/112 |
| 7,728,622 B2 | 6/2010 | Chua-Eoan et al. | |
| 7,733,145 B2 | 6/2010 | Abe et al. | |
| 7,894,248 B2 | 2/2011 | Yu et al. | |
| 8,004,882 B2 | 8/2011 | Katti et al. | |
| 8,135,768 B2 | 3/2012 | Stewart | |
| 2012/0105105 A1 | 5/2012 | Shukh | |

OTHER PUBLICATIONS

S.-M. Kang, Y. Leblebici, CMOS Digital Integrated Circuits: Analysis and Design, 3rd edition, McGraw-Hill, New York, 2003 (655 pages).
N.H.E. Weste, D.M. Harris, CMOS VLSI Design: A Circuits and Systems Perspective, 4th edition, Addison-Wesley, Boston, 2011 (838 pages).
Mirzaee R. F. et al., High Speed NP-CMOS and Multi-Output Dynamic Full Adder Cells, International J. of Electrical & Electronics Eng., v.4, p. 304 (2010).
Matsunaga S. et al., Fabrication of a Nonvolatile Full Adder Based on Logic-in-Memory Architecture Using Magnetic tunnel Junctions, Appl.Phys.Express, v.1, 091301 (2008).
Alioto M., Analysis and Comparison on Full Adder Block in Submicron Technology, IEEE Trans. VLSI Systems, v. 16, p. 806 (2002).

* cited by examiner

*Primary Examiner* — Don Le

(57) ABSTRACT

A nonvolatile full adder circuit comprising a full adder electrical circuitry comprising three input terminals for receiving two input and carry-in signals, a sum output terminal, and an carry-out output terminal; first and second nonvolatile memory elements electrically coupled to the first and second output terminal, respectively at their first ends and to an intermediate voltage source at their second ends. The nonvolatile memory elements comprise two stable logic states. A logic state each of the of the nonvolatile memory elements is controlled by a bidirectional electrical current running between its first and second ends. The full adder circuitry is electrically coupled to a high voltage source at its first source terminal and to a low voltage source at its second source terminal, wherein an electrical potential of the intermediate voltage source is lower than that of the high voltage source but higher than that of the low voltage source.

18 Claims, 9 Drawing Sheets

NONVOLATILE FULL ADDER CIRCUIT

CROSS-REFERENCE TO RELATED APPLICATIONS

This application claims the benefit of provisional patent application No. 61/493,407 filed on Jun. 3, 2011 by the present inventors.

FEDERALLY SPONSORED RESEARCH

Not Applicable

SEQUENCE LISTING OR PROGRAM

Not Applicable

RELEVANT PRIOR ART

U.S. Pat. No. 8,135,768, Mar. 13, 2012—Stewart

U.S. Patent Application Publication No. US 2012/0105105, May 3, 2012—Shukh

Matsunaga S. et al., Fabrication of Nonvolatile Full Adder Based on Logic-in-Memory Architecture Using Magnetic Tunnel Junctions, Applied Physics Express, vol. 1, 091301, 2008.

Kang S.-M. et al., CMOS Digital Integrated Circuits: Analysis and Design, 3$^{rd}$ edition, McGraw-Hill Companies, Inc., 2003.

BACKGROUND

A full adder is a fundamental logic circuit of numerous logic devices such as microcontrollers, processors, field programmable gate arrays (FPGAs) and many others. In general, a full adder represents an electronic circuit that has several inputs and two outputs, S (or SUM) and $C_{OUT}$ (or CARRY-OUT). The one-bit full adder 10 (FIG. 1) includes a logic block 12 electrically coupled to a high $V_{DD}$ and low $V_{SS}$ voltage sources, three input terminals A, B and C (or carry in bit $C_{IN}$) and two output terminals S and $C_{OUT}$. A functionality of the one-bit full adder can be described by the following logic functions:

$$S=A \oplus B \oplus C=ABC+AB^*C^*+A^*B^*C+A^*BC^*, \quad (1)$$

$$C_{OUT}=AB+AC+BC, \quad (2)$$

where A, B and C are input numbers with C (or $C_{IN}$) being derived from the previous logic block, A*, B* and C* (or $C_{IN}^*$) are negations (or complements) of A, B and C, respectively. A truth table for the one-bit full adder is given in Table 1.

There are a number of circuit designs of electronic blocks for performing SUM (S) and CARRY-OUT ($C_{OUT}$) functions. They are distinguished by the number and type of transistors, speed, voltage, power consumption, etc. These circuits are mostly built using a complimentary metal-oxide-semiconductor (CMOS) technology employing p-type and n-type of metal-oxide-semiconductor field effect transistors (MOSFETs) to perform logic functions. The CMOS-based adder circuits are volatile. They can lose their logic states when the power is off.

TABLE 1

Truth table for one-bit full adder

| A | B | C (or $C_{IN}$) | S | $C_{OUT}$ |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

A CMOS inverter is one of key elements of the full adder circuits. FIG. 2 shows a nonvolatile CMOS inverter 20 according to a prior art. The inverter 20 includes an p-type MOS (pMOS) transistor 2P1, an n-type MOS (nMOS) transistor 2N1, and a nonvolatile magnetoresitive (MR) memory element (or magnetic tunnel junction (MTJ)) 2J1. Gates of the pMOS transistor 2P1 and the nMOS transistor 2N1 are connected in common to serve as an input terminal IN. Drains of the transistors 2P1 and 2N1 also connected in common serve as an output terminal OUT. Sources of the pMOS transistor 2P1 and the nMOS transistor 2N1 are connected to voltage sources $V_{DD}$ and $V_{SS}$, respectively. The nonvolatile memory element 2J1 is connected to the output terminal OUT of the inverter 20 at its first end and to a memory (intermediate) voltage source $V_M$ at its second end, where $V_{DD} > V_M > V_{SS}$. The source terminal of the nMOS transistor 2N1 can be connected to a grounding source GRD ($V_{DD} > V_M >$ GRD). Moreover, the MTJ element 2J1 can also be connected to the grounding source GRD. In this case the following relation between electric potentials of the voltage sources can be observed: $V_{DD} >$ GRD $> V_{SS}$.

The MR element 2J1 can comprise at least a free (or storage) layer 22 with a reversible magnetization direction (shown by a dashed arrow), a pinned (or reference) layer 24 with a fixed magnetization direction (shown by a solid arrow), and a nonmagnetic insulating tunnel barrier layer 26 sandwiched in-between. Resistance of the memory element 2J1 depends on a mutual orientation of the magnetization directions in the free 22 and pinned 24 layers. The resistance has a highest value when the magnetization directions are antiparallel to each other, and the lowest value when they are parallel. Hence the magnetization direction of the free layer 22 can have two stable logic states. It can be controlled by a direction of a spin-polarized current $I_S$ running through the element 2J1 in a direction perpendicular to layers surface (or plane). The direction of the current $I_S$ and hence the magnetization direction of the free layer 22 depends of the polarity of the input signal at the gates of the transistors 2P1 and 2N1.

When an input signal IN=1 (logic "1") is applied to the common gate terminal of the transistors 2P1 and 2N1, the pMOS transistor 2P1 is "Off" and the nMOS transistor 2N1 is "On". The spin-polarized current $I_S$ is running in the direction from the memory source $V_M$ to the source $V_{SS}$. The current $I_S$ of this direction can force the magnetization direction of the free layer 22 in parallel to the magnetization direction of the pinned layer 24, which corresponds to a logic "0". When the input signal is changed to IN=0 (a logic "0"), the pMOS transistor 2P1 turns "On" but the nMOS transistor 2N1 is "Off". The spin-polarizing current $I_S$ is running in the opposite direction from the logic source $V_{DD}$ to the memory source $V_M$. As a result, the magnetization direction of the free layer 22 can be forced in antiparallel to the magnetization direction of the pinned layer 24. This mutual orientation of the magnetizations corresponds to a high resistance state or to logic "1".

Hence, the logic value of the memory element 2J1 corresponds to a logic value at the output terminal of the conventional volatile CMOS inverter. The memory element 2J1 can provide a nonvolatile storage of the logic state of the inverter 20. The data may not be lost when the power is off.

CMOS-based adders are volatile. They can lose their data when the power is off. The present disclosure addresses to this problem.

SUMMARY

Disclosed herein is a nonvolatile full adder circuit comprising: a full adder electrical circuitry comprising first input terminal for receiving first binary input signals, a second input terminal for receiving second binary input signals, a third input terminal for receiving binary carry-in signals, a first output terminal for providing a sum output signal, and a second output terminal for providing a carry-out signal; a high voltage source electrically coupled to a first source terminal of the full adder electrical circuitry; a low voltage source electrically coupled to a second source terminal of the full adder electrical circuitry; a first nonvolatile memory element comprising two stable logic states and electrically coupled to the first output terminal at its first end and to an intermediate voltage source at its second end, and a second nonvolatile memory element comprising two stable logic states and electrically coupled to the second output terminal at its first end and to the intermediate voltage source at its second end, wherein a logic state each of the nonvolatile memory elements is controlled by a bidirectional electrical current running between its first and second ends, and wherein an electrical potential of the intermediate voltage source is lower than that of the high voltage source but higher than that of the low voltage source.

Also disclosed is a nonvolatile full adder circuit comprising: a full adder electrical circuitry comprising a first input terminal for receiving first binary input signals, a second input terminal for receiving second binary input signals, a third input terminal for receiving binary carry-in signals, a first output terminal for providing a sum output signal, and a second output terminal for providing a carry-out signal; a first nonvolatile memory element comprising two stable logic states and electrically coupled to the first output terminal at its first end and to an intermediate voltage source at its second end, and a second nonvolatile memory element comprising two stable logic states and electrically coupled to the second output terminal at its first end and to the intermediate voltage source at its second end, wherein the first memory element provides a nonvolatile storage of the sum output signal and the second memory element provides the nonvolatile storage of the carry-out signal.

DETAILED DESCRIPTION

Figure 1:
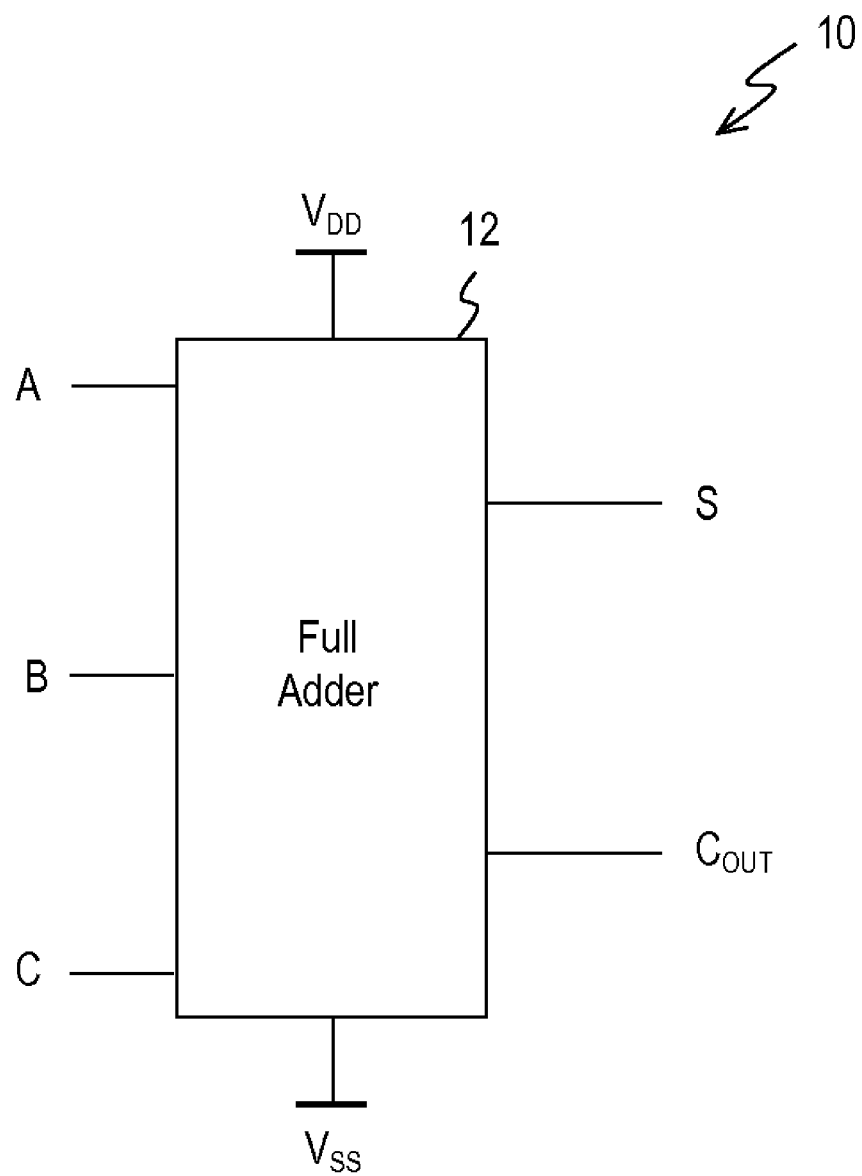
FIG. 1 is a block-level circuit diagram of a conventional one-bit full adder according to a prior art.

Embodiments of the present disclosure will be explained below with reference to the accompanying drawings. Note that in the following explanation the same reference numerals denote constituent elements having almost the same functions and arrangements, and a repetitive explanation will be made only when necessary.

Note also that each embodiment to be presented below merely discloses an device for embodying the technical idea of the present disclosure. An order of the embodiments can be any. Therefore, the technical idea of the present disclosure does not limit the materials, shapes, structures, arrangements, and the like of constituent parts to those described below. The technical idea of the present disclosure can be variously changed within the scope of the appended claims.

Figure 2:
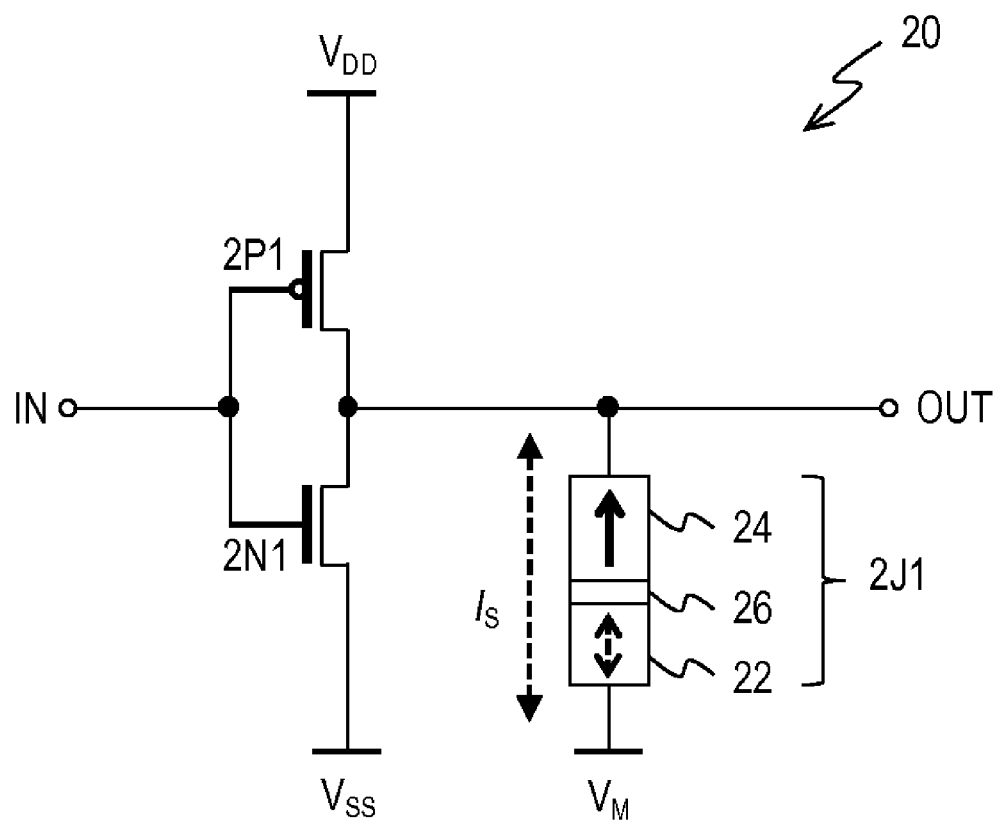
FIG. 2 is a transistor-level circuit diagram of a nonvolatile CMOS inverter according to a prior art.

Refining now to the drawings, FIG. 2 illustrates a prior art. Specifically, the figure shows a magnetoresistive (MR) element (or magnetic tunnel junction (MTJ)) having a multilayer structure with ferromagnetic free and pinned layers having a perpendicular anisotropy. The MR element 2J1 shown in FIG. 2 for illustrative purpose comprises only the free 22 and pinned 24 magnetic layers separated by a tunnel barrier layer 26. Note that additional layers can also be included in the structure of the MR element 2J1. The ferromagnetic layers 22 and 24 may also have an in-plane direction of the magnetization without departing from a scope of the present disclosure. The direction of the magnetization in the magnetic layers 22 and 24 are shown by dashed or solid arrows. The MR element 2J1 can store binary data by using steady logic states determined by a mutual orientation of the magnetizations in the free 22 and pinned 24 ferromagnetic layers separated by a tunnel barrier layer 26. The logic state "0" or "1" of the MR element 2J1 can be changed by a spin-polarized current $I_S$ running through the element in the direction perpendicular to layers surface (or substrate).

The MR element herein mentioned in this specification and in the scope of claims is a general term of a tunneling magnetoresistance element using a nonmagnetic insulator or semiconductor as the tunnel barrier layer.

Figure 3A:
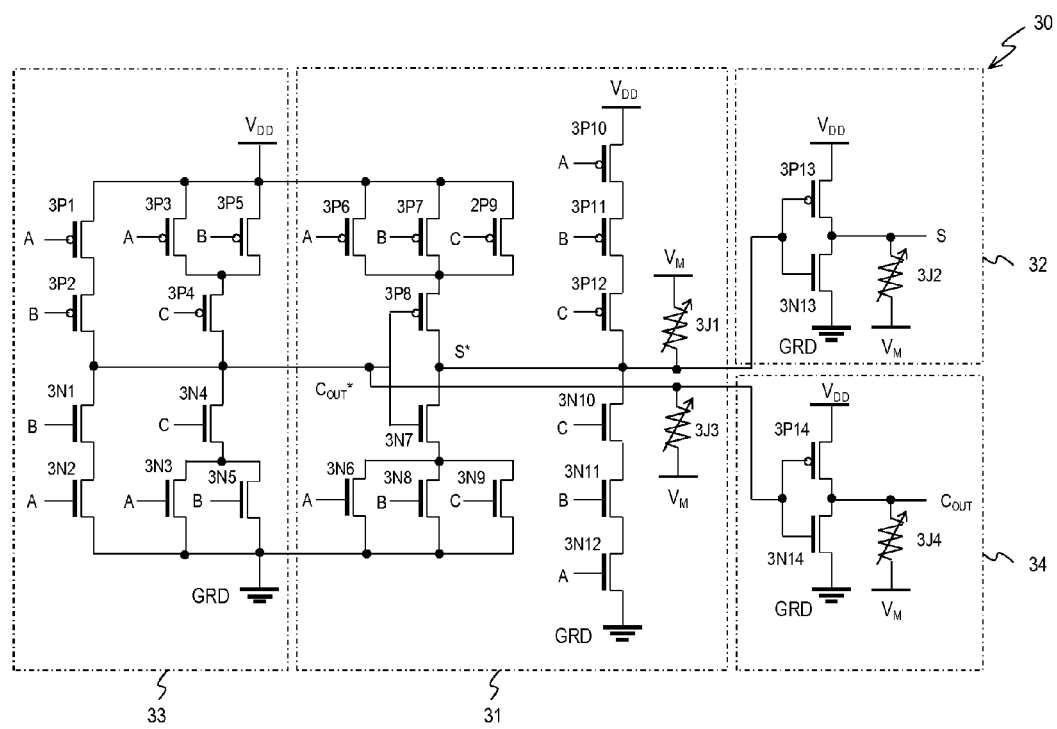
FIGS. 3A and 3B are transistor-level and gate-level circuit diagrams, respectively of a nonvolatile conventional CMOS-based full adder according to a first embodiment of the present disclosure.
Figure 3B:
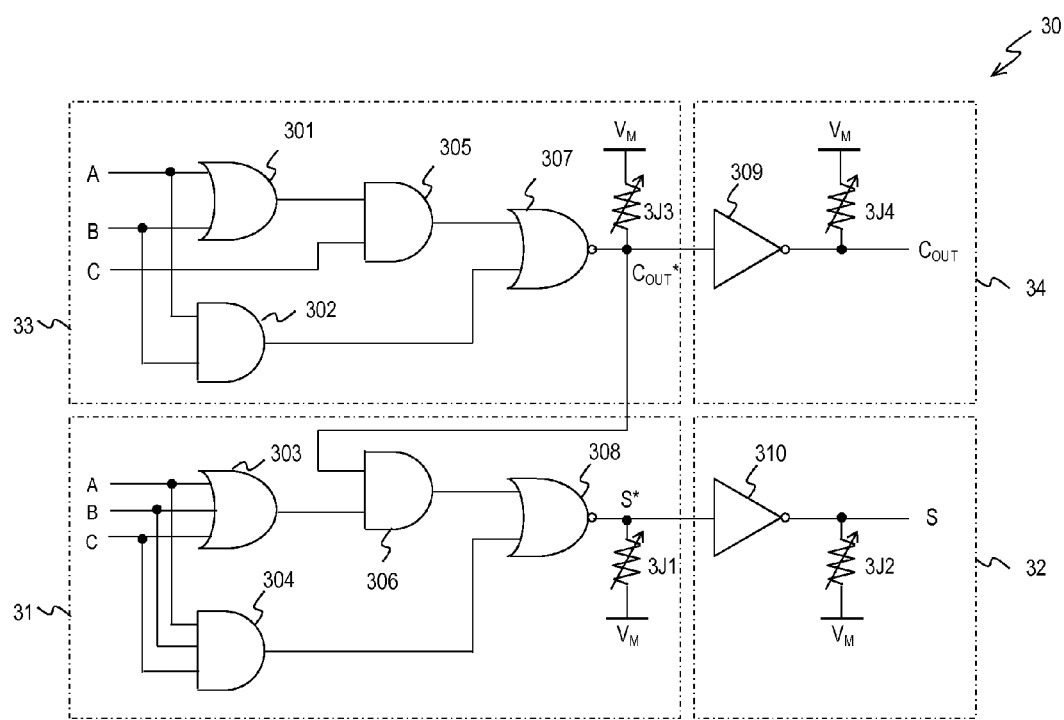

FIGS. 3A and 3B show a transistor-level and gate-level circuit diagrams, respectively of a nonvolatile one-bit full adder 30 according to a first embodiment of the present disclosure. FIG. 3A shows the transistor-level circuit diagram of a nonvolatile conventional CMOS-based full adder 30 according to a first embodiment of the disclosure. The nonvolatile full adder 30 comprises four logic blocks 31-34.

The logic block 33 implements an inverted CARRY function. It includes five pMOS transistors 3P1-3P5 that perform a pull-up function and five nMOS transistors 3N1-3N5 performing pull-down function, and a MR memory element 3J3. Source terminals of the pMOS transistors 3P1, 3P3 and 3P5 are connected to a high voltage source $V_{DD}$. Source terminals of the nMOS transistors 3N2, 3N3, and 3N5 are connected to the grounding source GRD. Drain terminals of the pMOS transistor 3P4 and the nMOS transistor 3N4 connected in common serve as an output terminal of the logic block 33. The CARRY block 33 receives thee three inputs A, B, and C, and implements an inverted CARRY function $C_{OUT}^*$. A logic value $C_{OUT}^*$ can be stored in the nonvolatile memory element 3J3. The MTJ element 3J3 employs a spin induced writing mechanism that was described above for the nonvolatile inverter 20 shown in FIG. 2. The memory element 3J3 can be connected to the output terminal of the block 33 at its first end and to a memory voltage source $V_M$ at its second end, where $V_{DD}$>$V_M$>GRD.

The logic block 34 inverts the inverted output signal $C_{OUT}$* of the carry block 33 to provide a carry output $C_{OUT}$. The inverter block 34 can include an pMOS transistor 3P14, an nMOS transistor 3N14, and a nonvolatile memory element 3J4 connected to the output terminal of the CMOS inverter formed by the transistors 3P14 and 3N14 at its first end and to the memory voltage source $V_M$ at its second end. The source terminals of the pMOS transistor 3P14 and the nMOS transistor 3N14 can be connected to the voltage sources $V_{DD}$ and GRD, respectively. The MR element 3J4 can provide a nonvolatile storage of the value $C_{OUT}$.

A logic block 31 comprises seven pMOS transistors 3P6-3P12 and seven nMOS transistor 3N6-3N12 forming a pull-up and pull-down circuits, respectively, and an MR element 3J1. The nonvolatile memory element 3J1 can be connected to the output terminal of the logic block 31 at its first end and to the memory voltage source $V_M$ at its second end. The logic block 31 can perform an inverted sum function S*. It can receive the inverted carry output $C_{OUT}$* outputted from the inverted carry block 33, and three input signals A, B, and C. Logic value of the inverted output S* can be stored in the nonvolatile memory element 3J1. The output S* of the inverted sum block 31 can be applied to the input of the nonvolatile inverter block 32 composed by the transistors 3P13 and 3N13, and a nonvolatile MR element 3J2. The memory element 3J2 is connected to the output terminal of the CMOS inverter composed by the transistors 3P13 and 3N13 at its first end and to the memory voltage source $V_M$ at its second end. The memory element 3J2 can provide a nonvolatile storage of the value S. The nonvolatile full adder 30 can provide a full-swing output and good driving capabilities.

Note that other combinations of voltage sources can be used, for example the memory elements 3J1-3J4 can be connected to the grounding voltage source GRD at their second ends while the source terminal of the nMOS transistors 3N2, 3N3, 3N5, 3N6, 3N8, 3N9, 3N12, and 3N14 being connected to the low voltage source $V_{SS}$. For these connections the following correlation between electrical potentials of the voltage sources is true: $V_{DD}$>GRD>$V_{SS}$.

FIG. 3B shows the logic gate-level circuit diagram of the nonvolatile one-bit full adder 30 disclosed above (FIG. 3A). The nonvolatile full adder 30 comprises four logic blocks 31-34. The logic blocks 31 and 32 implement a SUM function. The logic blocks 33 and 34 implement a CARRY function. The logic block 33 represents an inverted carry block that comprises an OR logic gate 301, two AND gates 302 and 305, an NOR gate 307, and an MR element 3J3 connected to the output terminal of the NOR gate 307 at its first end and to the memory voltage source $V_M$ at its second end. The logic block 34 implements a NOT function. It comprises an inverter 309 and an MR element 3J4 connected to the output terminal of the inverter 309 at its first end and to the memory voltage source $V_M$ at its second end. The memory elements 3J3 and 3J4 provides a nonvolatile storage of $C_{OUT}$* and $C_{OUT}$ values, respectively. Note that one of the memory elements 3J3 or 3J4 may be omitted without violating the non-volatility of the circuit.

The SUM function is implemented by the logic blocks 31 and 32. The logic block 31 receives the inverted carry-out signal $C_{OUT}$* outputted from the first logic block 33, and three inputs A, B, and C to implement an inverted sum S*. The block 31 comprises an OR logic gate 303, two AND gates 304 and 306, an NOR gate 308, and an MR element 3J1. The nonvolatile memory element 3J1 can be connected to the output terminal of the NOR gate 308 at its first end and to the memory voltage source $V_M$ at its second end. The MR element 3J1 can store an S* logic value. The output terminal of the logic block 31 is connected to the input terminal of the logic block 32 that is composed of an NOT gate 310 and an MR element 3J2. The memory element 3J2 can be connected to the output terminal of the NOT gate 310 at its first end and to the memory voltage source $V_M$ at its second end. The memory elements 3J1 and 3J2 can provide a nonvolatile storage of S* and S logic values, respectively.

The nonvolatile full adder 30 shown in FIGS. 3A and 3B can include four MR elements 3J1-3J4 to provide the nonvolatile storage of the logic values S, S*, $C_{OUT}$, and $C_{OUT}$*. Note that the number of the MR elements of the nonvolatile adder 30 can be different from the indicated above, for example the MR elements 3J1 and 3J3 can be omitted.

Figure 4A:
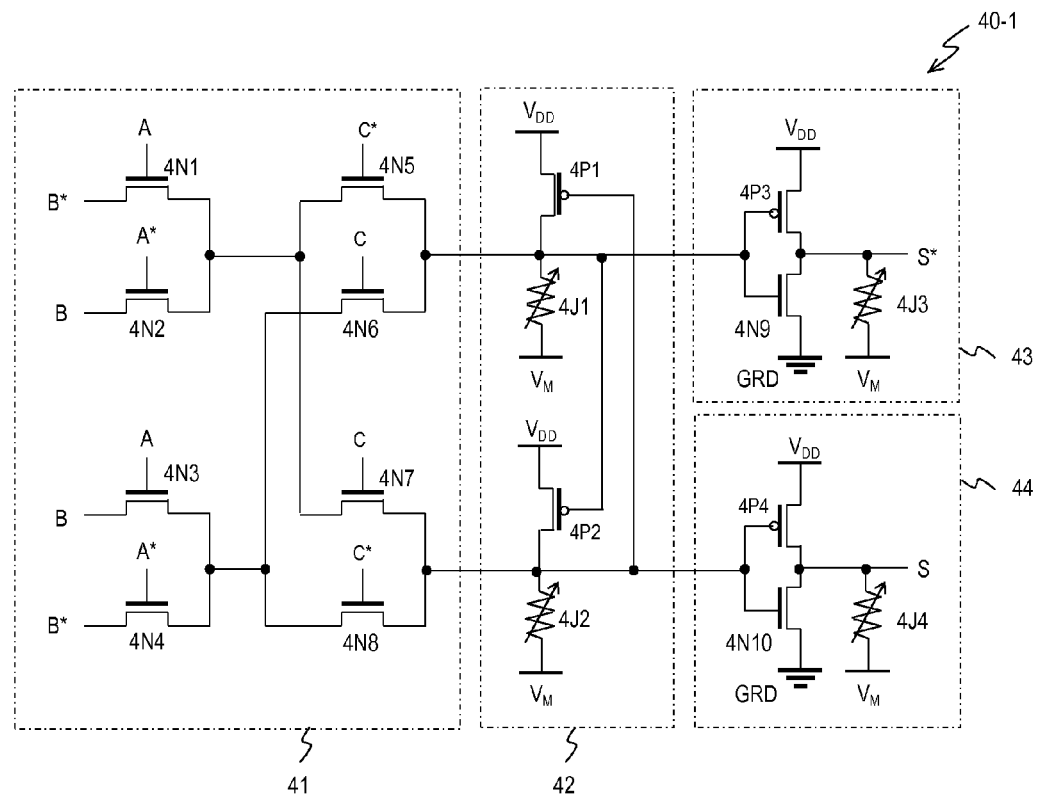
FIGS. 4A and 4B are transistor-level circuit diagrams of sum and carry modules, respectively of a nonvolatile complementary pass-transistor logic full adder according to a second embodiment of the present disclosure.
Figure 4B:
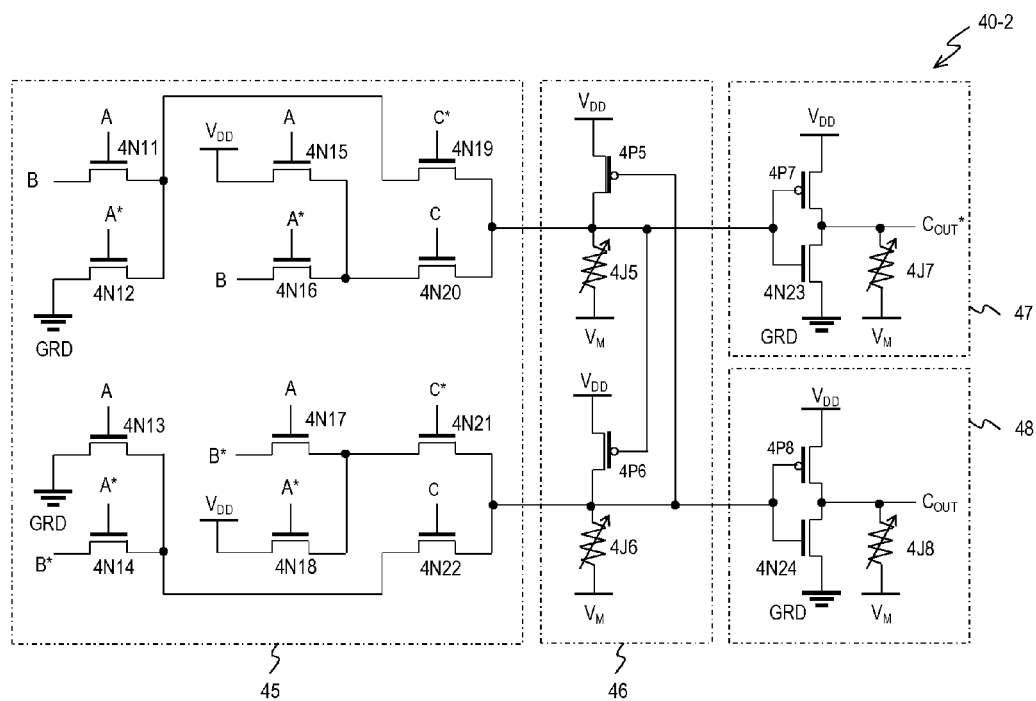

FIGS. 4A and 4B show transistor-level circuit diagrams of nonvolatile logic modules 40-1 and 40-2 implementing SUM (FIG. 4A) and CARRY (FIG. 4B) functions, respectively according to a second embodiment of the disclosure. The modules 40-1 and 40-2 represent a nonvolatile complementary pass-transition logic (CPL) full adder. The sum logic module 40-1 (FIG. 4A) can comprise four logic blocks 41-44. The logic block 41 is a matrix block comprising eight nMOS transistors 4N1-4N8 with twelve inputs for A, A*, B, B*, C, and C* signals. The nonvolatile logic block 42 represents a pull-up block comprising two pMOS transistors 4P1 and 4P2, and two MR elements 4J1 and 4J2. The memory element 4J1 can be connected to drain terminals (or to a common drain terminal) of the transistors 4P1, 4N5, and 4N6 at its first end and to the memory voltage source $V_M$ at its second end. Respectively, the MR element 4J2 can be connected to the drain terminals (or to a common drain terminal) of the transistor 4P2, 4N7, and 4N8 at its first end and to the memory voltage source $V_M$ at its second end. Source terminals of the pMOS transistors 4P1 and 4P2 can be connected to the logic voltage source $V_{DD}$.

The nonvolatile inverter 43 can include a pMOS transistor 4P3 and an nMOS transistor 4N9, and an MR element 4J3. The nonvolatile memory element 4J3 can be connected to the drain terminals (or to a common drain terminal) of the transistors at its first end and to the memory voltage source $V_M$ at its second end. The MR element 4J3 can provide a nonvolatile storage of the logic value S*. The source terminal of the pMOS transistor 4P3 can be connected to the high voltage source $V_{DD}$, and the source terminal of the nMOS transistor 4N9 can be connected to the ground source GRD, where $V_{DD}$>$V_M$>GRD. The nonvolatile inverter 44 can comprise an pMOS transistor 4P4, an nMOS transistor 4N10, and an MR element 4J4. The MR element 4J4 can provide a nonvolatile storage of the logic value S.

The nonvolatile carry module 40-2 is shown in FIG. 4B. The logic module 40-2 can comprise four logic blocks 45-48. The logic block 45 is a matrix block comprising twelve nMOS transistors 4N11-4N22 and sixteen inputs for signals A, A*, B, B*, C, and C*. Source terminals of the transistors 4N12 and 4N13 can be connected to the ground voltage source GRD. Drain terminals of the transistors 4N15 and 4N18 can be connected to the high voltage source $V_{DD}$. The nonvolatile logic block 46 represents a pull-up block. It can comprise two pMOS transistors 4P5 and 4P6, and two MR elements 4J5 and 4J6. The MR element 4J5 can be connected to the drain terminals (or to a common drain terminal) of the transistors 4N19, 4N20 and 4P5 at its first end and to the memory voltage source $V_M$ at its second end. The source terminals of the transistors 4P5 and 4P6 can be connected to the high voltage source $V_{DD}$. Respectively, the MR element 4J6 can be connected to the drain terminals of the transistors 4N21, 4N22 and 4P6 at its first end and to the memory voltage source $V_M$ at its second end, where $V_{DD}>V_M>GRD$. The MR elements can provide a nonvolatile storage of the output signals of the logic block 46.

The nonvolatile inverter 47 can include an pMOS transistor 4P7, an nMOS transistor 4N13, and an MR element 4J7 electrically connected to the drain terminals of the transistors 4P7 and 4N13 at its first end and to the memory voltage source $V_M$ at its second end. The source terminals of the transistors 4P7 and 4N23 can be connected to the high voltage source $V_{DD}$ and to the grounding source GRD, respectively, where $V_{DD}>V_M>GRD$. The nonvolatile inverter 48 can comprise an pMOS transistor 4P8, an nMOS transistor 4N24 and an MR element 4J8, respectively. The MR elements 4J7 and 4J8 can provide a nonvolatile storage of $C_{OUT}{}^*$ and $C_{OUT}$ logic values of the carry module 40-2, respectively.

The nonvolatile full adder 40 shown in FIGS. 4A and 4B can comprise eight MR elements 4J1-4J8 to provide the nonvolatile storage of the logic values. Note that the number of the MR elements of the nonvolatile adder 40 can be different from the indicated above, for example the MR elements 4J1, 4J2, 4J5, and 4J6 can be omitted.

Figure 5A:
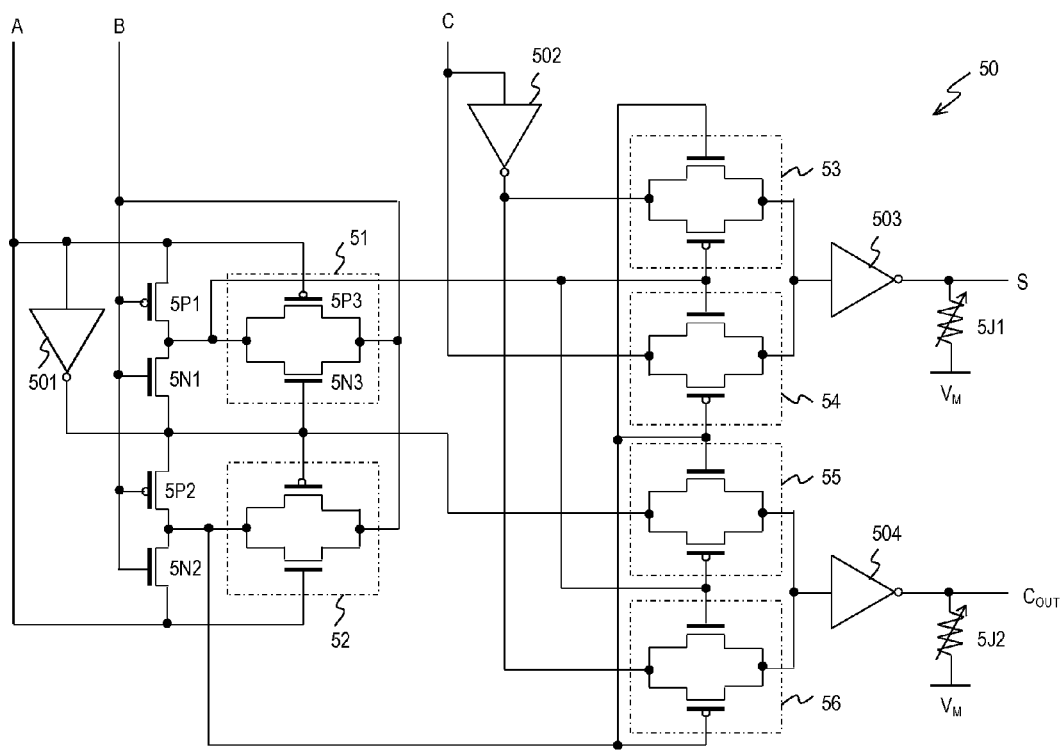
FIGS. 5A and 5B are a transistor-level and gate-level circuit diagrams of a nonvolatile CMOS transmission gates full adder according to a third embodiment of the present disclosure.
Figure 5B:
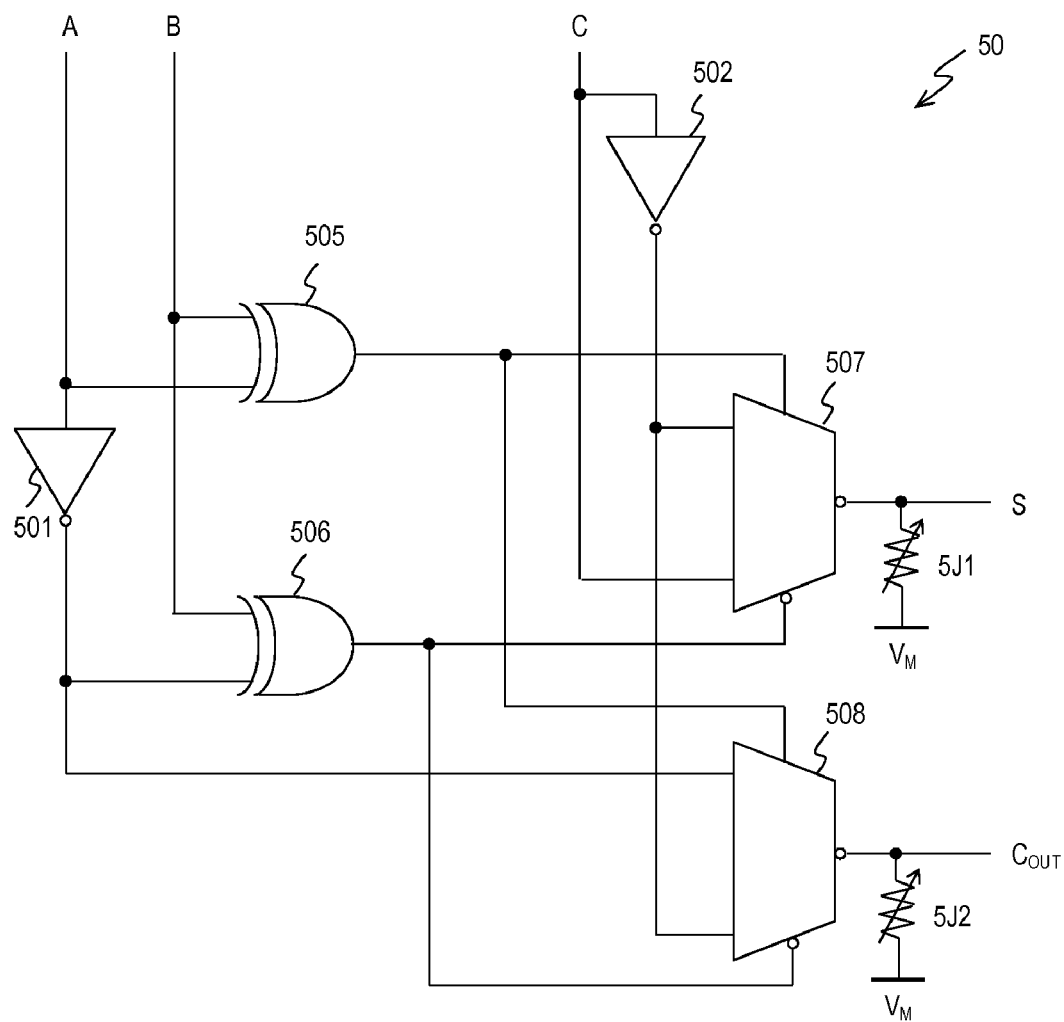

FIGS. 5A and 5B show a transistor-level and gate-level circuit diagrams of a nonvolatile one-bit full adder 50 constructed according to a third embodiment of the present disclosure. The diagrams represent the nonvolatile transmission-gates full adder 50.

The transistor-level nonvolatile full adder 50 is shown in FIG. 5A. It can include four inverters 501-504, six transmission gates 51-56, two pMOS transistors 5P1, 5P2 and two nMOS transistors 5N1, 5N2 connected in series, and two nonvolatile MR elements 5J1 and 5J2. The transmission gate 51 can comprise an pMOS transistor 5P3 and an nMOS transistor 5N3 connected in parallel to each other. The transmission gates 52-56 can have similar design. The MR element 5J1 can be electrically coupled to the output terminal of the inverter 503 at its first end and to the memory voltage source $V_M$ at its second end to provide a nonvolatile storage of the logic value S. Respectively, the MR element 5J2 can be electrically coupled to the output terminal of the inverter 504 at its first end and to the memory voltage source $V_M$ at its second end to provide a nonvolatile storage of the logic value $C_{OUT}$.

The logic gate-level circuit diagram of the nonvolatile full adder 50 is given in FIG. 5B. The nonvolatile full adder 50 can comprise two inverters 501 and 502, two XOR logic gates 505 and 506, two multiplexers 507 and 508, and two MR memory elements 5J1 and 5J2. The memory element 5J1 can be electrically coupled to the output terminal of the multiplexer 507 at its first end and to the memory voltage source $V_M$ at its second end. The MR element 5J1 can provide the nonvolatile storage of the logic value S. Respectively, the MR element 5J2 can be connected to the output terminal of the multiplexer 508 at its first end and to the memory voltage source $V_M$ at its second end to provide the nonvolatile storage of the logic value $C_{OUT}$.

Figure 6:
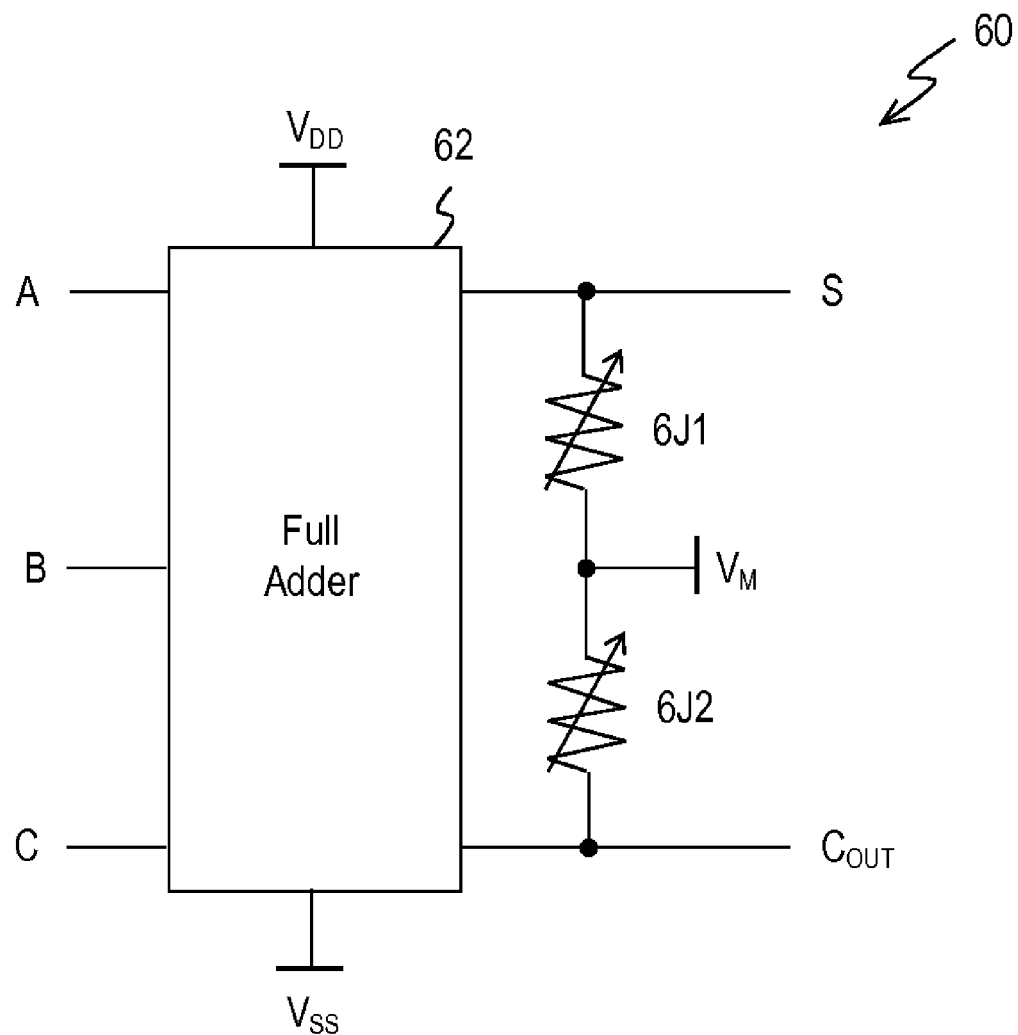
FIG. 6 is a block-level circuit diagram of a nonvolatile full adder of an embodiment according to the present disclosure.

FIG. 6 shows a block-level circuit diagram of the nonvolatile one-bit full adder 60 according to an embodiment of the present disclosure. The nonvolatile adder 60 can comprise a logic block 62 for performing SUM and CARRY logic functions, three input terminals for logic values A, B, and C, two output terminals for logic values S and $C_{OUT}$, and two nonvolatile memory elements 6J1 and 6J2. One memory element 6J1 can be electrically coupled to the S output terminal of the logic block 62 at its first end and to the memory voltage source $V_M$ at its second end. Another nonvolatile memory element 6J2 can be connected to the $C_{OUT}$ output terminal at its first end and to the memory voltage source $V_M$ at its second end. The MR elements 6J1 and 6J2 can provide the nonvolatile storage of the logic values S and $C_{OUT}$, respectively. The logic block 62 can be electrically connected to the high voltage source $V_{DD}$ at its first source terminal and to the low voltage source $V_{SS}$ at its second source terminal, where $V_{DD}>V_M>V_{SS}$. Note that one of the voltage sources can be replaced by a grounding source GRD, for example the MR elements 6J1 and 6J2 can be electrically coupled to GRD source at their second ends. In this case the following correlation between electrical potentials of the voltage sources can be observed: $V_{DD}>GRD>V_{SS}$.

The full adder circuits shown in FIGS. 3-6 employ the MR elements (or MTJs) as nonvolatile memory elements. Note that the MR elements can be replaced by another nonvolatile memory elements such as a phase change memory element, resistive memory element and others without departing from the scope of the present disclosure.

The disclosed nonvolatile full adder circuits comprise the nonvolatile memory elements disposed above a CMOS logic circuitry formed on a wafer. The embedded nonvolatile memory elements can have a marginal impact on a design and manufacturing process of the conventional volatile CMOS-based adder circuits.

While the specification of this disclosure contains many specifics, these should not be construed as limitations on the scope of the disclosure or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

It is understood that the above embodiments are intended to be illustrative, and not restrictive. Many other embodiments will be apparent to those of skill in the art upon reviewing the above description. The scope of the embodiments should be, therefore, determined with reference to the appended claims, along with the full scope of equivalents to which such claims are entitled.

While the disclosure has been described in terms of several exemplary embodiments, those skilled in the art will recognize that the disclosure can be practiced with modification within the spirit and scope of the appended claims. Specifically, one of ordinary skill in the art will understand that the drawings herein are meant to be illustrative, and the spirit and scope of the disclosure are not limited to the embodiments and aspects disclosed herein but may be modified.

What is claimed is:

1. A nonvolatile full adder circuit comprising:
   a full adder electrical circuitry comprising first input terminal for receiving first binary input signals, a second input terminal for receiving second binary input signals, a third input terminal for receiving binary carry-in signals, a first output terminal for providing a sum output signal, and a second output terminal for providing a carry-out signal;

a high voltage source electrically coupled to a first source terminal of the full adder electrical circuitry;

a low voltage source electrically coupled to a second source terminal of the full adder electrical circuitry;

a first nonvolatile memory element comprising two stable logic states and electrically coupled to the first output terminal at its first end and to an intermediate voltage source at its second end, and a second nonvolatile memory element comprising two stable logic states and electrically coupled to the second output terminal at its first end and to the intermediate voltage source at its second end, wherein a logic state each of the nonvolatile memory elements is controlled by a bidirectional electrical current running between its first and second ends, and wherein an electrical potential of the intermediate voltage source is lower than that of the high voltage source but higher than that of the low voltage source.

2. The nonvolatile full adder circuit of claim 1, further comprising at least:

a third output terminal for providing a complement of the sum output signal;

a fourth output terminal for providing a complement of the carry-out signal;

a third nonvolatile memory element comprising two stable logic states and electrically coupled to the third output terminal at its first end and to an intermediate voltage source at its second end, and a fourth nonvolatile memory element comprising two stable logic states and electrically coupled to fourth output terminal at its first end and to the intermediate voltage source at its second end.

3. The nonvolatile full adder circuit of claim 1, wherein the nonvolatile memory elements are magnetoresistive elements.

4. The nonvolatile full adder circuit of claim 3, wherein each of the magnetoresistive elements comprises at least a free ferromagnetic layer comprising a reversible magnetization direction, a pinned ferromagnetic layer comprising a fixed magnetization direction, and a nonmagnetic insulating tunnel barrier layer disposed between the free and pinned layers.

5. The nonvolatile full adder circuit of claim 4, wherein the magnetization direction of the free ferromagnetic layer comprises a first logic state that is parallel to the magnetization direction of the pinned layer and a second logic state that is antiparallel to the magnetization direction of the pinned layer.

6. The nonvolatile full adder circuit of claim 4, wherein the magnetization directions of the free and pinned ferromagnetic layers are substantially perpendicular to a layers surface.

7. The nonvolatile full adder circuit of claim 4, wherein the magnetization directions of the free and pinned layers are substantially parallel to the layers surface.

8. The nonvolatile full adder circuit of claim 1, wherein the nonvolatile memory elements comprise a phase change material which has a high resistance state when it is in an amorphous state and has a low resistance state when it is in a crystalline state.

9. A nonvolatile full adder circuit comprising:

a full adder electrical circuitry comprising a first input terminal for receiving first binary input signals, a second input terminal for receiving second binary input signals, a third input terminal for receiving binary carry-in signals, a first output terminal for providing a sum output signal, and a second output terminal for providing a carry-out signal;

a first nonvolatile memory element comprising two stable logic states and electrically coupled to the first output terminal at its first end and to an intermediate voltage source at its second end, and a second nonvolatile memory element comprising two stable logic states and electrically coupled to the second output terminal at its first end and to the intermediate voltage source at its second end, wherein the first memory element provides a nonvolatile storage of the sum output signal and the second memory element provides the nonvolatile storage of the carry-out signal.

10. The nonvolatile full adder of claim 9, further comprising:

a high voltage source electrically coupled to a first source terminal of the full adder electrical circuitry, and a low voltage source electrically coupled to a second source terminal of the full adder electrical circuitry, wherein an electrical potential of the intermediate voltage source is lower than that of the high voltage source but higher than that of the low voltage source.

11. The nonvolatile full adder circuit of claim 9, further comprising at least:

a third output terminal for providing a complement of the sum output signal;

a fourth output terminal for providing a complement of the carry-out signal;

a third nonvolatile memory element comprising two stable logic states and electrically coupled to the third output terminal at its first end and to the intermediate voltage source at its second end, and a fourth nonvolatile memory element comprising two stable logic states and electrically coupled to the fourth output terminal at its first end and to the intermediate voltage source at its second end.

12. The nonvolatile full adder circuit of claim 9, wherein a logic state of the of the nonvolatile memory elements is controlled by a bidirectional electrical current running between their first and second ends.

13. The nonvolatile full adder circuit of claim 9, wherein the nonvolatile memory elements are magnetoresistive elements.

14. The nonvolatile full adder circuit of claim 13, wherein each of the magnetoresistive elements comprises at least a free ferromagnetic layer comprising a reversible magnetization direction, a pinned ferromagnetic layer comprising a fixed magnetization direction, and a nonmagnetic insulating tunnel barrier layer disposed between the free and pinned layers.

15. The nonvolatile full adder circuit of claim 14, wherein the magnetization direction of the free ferromagnetic layer comprises a first logic state that is parallel to the magnetization direction of the pinned layer and a second logic state that is antiparallel to the magnetization direction of the pinned layer.

16. The nonvolatile full adder circuit of claim 14, wherein the magnetization directions of the free and pinned ferromagnetic layers are substantially perpendicular to a layers surface.

17. The nonvolatile full adder circuit of claim 14, wherein the magnetization directions of the free and pinned layers are substantially parallel to the layers surface.

18. The nonvolatile full adder circuit of claim 9, wherein the nonvolatile memory elements comprise a phase change material which has a high resistance state when it is in an amorphous state and has a low resistance state when it is in a crystalline state.

* * * * *